United States Patent
Doyle

(10) Patent No.: US 6,653,708 B2
(45) Date of Patent: Nov. 25, 2003

(54) COMPLEMENTARY METAL OXIDE SEMICONDUCTOR WITH IMPROVED SINGLE EVENT PERFORMANCE

(75) Inventor: Brent R. Doyle, Malabar, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/918,208

(22) Filed: Jul. 30, 2001

(65) Prior Publication Data

US 2002/0020858 A1 Feb. 21, 2002

Related U.S. Application Data

(60) Provisional application No. 60/223,847, filed on Aug. 8, 2000.

(51) Int. Cl.[7] .................... H01L 29/00; H01L 27/082; H01L 27/102; H01L 29/70; H01L 31/11
(52) U.S. Cl. .................... 257/499; 257/544; 257/549; 257/552; 257/593
(58) Field of Search .................... 257/499, 544, 257/552, 593, 549, 370

(56) References Cited

U.S. PATENT DOCUMENTS

| | | | |
|---|---|---|---|
| 4,734,382 A | * 3/1988 | Krishna | 437/31 |
| 4,847,522 A | 7/1989 | Fuller et al. | 307/473 |
| 4,881,105 A | 11/1989 | Davari et al. | 357/23.4 |
| 4,890,142 A | 12/1989 | Tonnel et al. | 357/23.4 |
| 4,912,054 A | 3/1990 | Tomassetti | 437/31 |
| 4,921,811 A | 5/1990 | Watanabe et al. | 437/31 |
| 4,929,570 A | * 5/1990 | Howell | 437/89 |
| 4,980,744 A | 12/1990 | Watanabe et al. | 357/42 |
| 5,049,967 A | 9/1991 | Watanabe et al. | 357/42 |
| 5,087,579 A | 2/1992 | Tomassetti | 437/31 |
| 5,148,255 A | 9/1992 | Nakazato et al. | 357/43 |
| 5,156,989 A | 10/1992 | Williams et al. | 437/41 |
| 5,330,922 A | 7/1994 | Erdeljac et al. | 437/30 |
| 5,386,135 A | 1/1995 | Nakazato et al. | 257/369 |
| 5,441,900 A | * 8/1995 | Bulucea et al. | 437/24 |
| 5,455,189 A | * 10/1995 | Grubisich | 437/34 |
| 5,471,085 A | 11/1995 | Ishigaki et al. | 257/370 |
| 5,485,027 A | 1/1996 | Williams et al. | 257/343 |
| 5,497,023 A | 3/1996 | Nakazato et al. | 257/394 |
| 5,508,549 A | 4/1996 | Watanabe et al. | 257/370 |
| 5,672,897 A | 9/1997 | Watanabe et al. | 257/370 |
| 5,751,183 A | 5/1998 | Lee | 327/542 |
| 5,889,315 A | * 3/1999 | Farrenkopf et al. | 257/552 |
| 5,899,714 A | * 5/1999 | Farrenkopf et al. | 438/202 |
| 6,107,146 A | * 8/2000 | Gardner et al. | 438/300 |
| 6,208,010 B1 | 3/2001 | Nakazato et al. | 257/544 |
| 6,228,726 B1 | * 5/2001 | Liaw | 438/294 |
| 6,245,609 B1 | * 6/2001 | Tsai et al. | 438/234 |

* cited by examiner

Primary Examiner—Wael Fahmy
Assistant Examiner—Shrinivas H Rao
(74) Attorney, Agent, or Firm—Allen, Dyer, Doppelt, Milbrath & Gilchrist, P.A.

(57) ABSTRACT

A junction isolated Complementary Metal Oxide Semiconductor (CMOS) transistor device includes a substrate of a first conductivity type and first and second buried layers formed within the substrate and having a second conductivity type opposite from the first conductivity type. First and second well regions of respective first and second conductivity are formed above respective first and second buried layers. An NMOS transistor and PMOS transistor are formed in the respective first and second well regions. The buried layer of the NMOS transistor is at −V (typically ground) and the buried layer of the PMOS transistor is biased at a positive supply voltage and spaced sufficiently from the NMOS transistor to improve single event effects occurrence.

14 Claims, 3 Drawing Sheets

COMPLEMENTARY METAL OXIDE SEMICONDUCTOR WITH IMPROVED SINGLE EVENT PERFORMANCE

RELATED APPLICATION

This application is based upon prior filed provisional application Serial No. 60/223,847 filed Aug. 8, 2000.

FIELD OF THE INVENTION

This invention relates to the field of transistors, and more particularly, this invention relates to junction isolated Complementary Metal Oxide Semiconductor (CMOS) transistor devices.

BACKGROUND OF THE INVENTION

In a standard junction isolated Complementary Metal Oxide Semiconductor transistor device using a P-substrate and N-buried layer, Single Event Effects performance is degraded because of parasitic vertical NPN bipolar action in the N-channel MOS device. As is well known to those skilled in the art, one standard layout places both NMOS and PMOS transistor devices over a common N-conductivity buried layer, which is biased to a positive voltage, such as five volts, and acts as the electrical contact to the PMOS N-well. The N-conductivity buried layer is common with the device next to it and are both tied to the supply voltage. The source and the body are tied together respective to the body of the P-channel.

For the NMOS, the N-conductivity buried layer acts as a collector of a parasitic, vertical, bipolar NPN transistor. The P-well is the base region and the N+ source/drains are emitters. For this parasitic NPN bipolar transistor, the collector is at +5 volts and the P-well is tied to the source back through a body contact.

The drain, depending on the state of the device, is at a logic 0 state, i.e., 0 volts. In some space applications, e.g., satellite circuits, where heavy ions bombard the circuit, a Single Event Effect (SEE) performance can be a problem. For example, heavy ions, such as an iron ion, can pass through a space craft or satellite into a semiconductor integrated circuit, passing through the NMOS transistor device as described before, and thus, through the parasitic, vertical NPN transistor to create a charged ion track. As a result, the device dumps a charge into the base node and the series resistance back to the body contact is high enough to internally forward bias the base/emitter junction, thus, turning on this parasitic NPN transistor. Whatever charge was dumped into the base is beta multiplied because it is biased in the active region.

The emitter acting as the drain of the MOS device is grounded. The collector is at +5 volts and the base has been pumped to where it is forward biased by dumping that charge into the P-well. Thus, a large dump of current is formed into the drain and the MOS device may not be sized sufficiently large enough to handle the amount of current. As a result, the device is driven out of the logic zero state and driven into an error state to a logic 1 state. This creates a logic fault that could propagate when the circuit is tied into a toggle input of a flip flop. This would clock the flip flop, creating potentially adverse consequences.

SUMMARY OF THE INVENTION

It is therefore an object of the present invention to form a CMOS transistor device of the type as described that has reduced Single Event Effect performance.

The present invention is advantageous and provides a junction isolated CMOS transistor device where the N-conductivity buried layer under the NMOS transistor device is separated from the N-conductivity buried layer under the PMOS transistor device. The layer under the NMOS is now tied to ground. As a result, the parasitic bipolar transistor will not be in the active region any more. It is possible to have a charge dumped, and still forward bias the base emitter, but without beta multiplication. This results from the N-buried layer collector, now at zero volts, as not being biased for current to flow.

In accordance with the present invention, a Complementary Metal Oxide Semiconductor (CMOS) transistor device includes a substrate of a first conductivity type and first and second buried layers formed within the substrate and having a second conductivity type opposite the first conductivity type. First and second well regions of respective first and second conductivity are formed at respective first and second buried layers. A NMOS transistor and PMOS transistor are formed at respective first and second well regions. In one aspect of the present invention, the buried layer having the NMOS transistor is grounded and the buried layer having the PMOS transistor is biased at a positive signal voltage to improve Single Events Effects occurrence. The two transistors are sufficiently spaced to obtain proper breakdown voltage.

In another aspect of the present invention, the conductivity of all the layers can be reversed. This results in a CMOS process that has an N-type substrate and a P-buried layer. The P-buried layer would be tied to the -supply voltage, typically 0V, as it is in electrical contact with the NMOS body which must be tied to 0V for proper circuit operation. The parasitic device of concern now becomes a parasitic vertical PNP where the PNP emitter is formed by the PMOS drain, the PNP base is formed by the PMOS body and the PNP collector is the P-buried layer. This PMOS device could be used as the pull-up device in a logic gate, for example, in the logic 1 state. If a heavy ion now passes through the above described layers, the PNP can be turned on pulling beta multiplied current out of the PMOS drain. This could result in the logic 1 state being corrupted. The analogous solution in this case is to separate the P-buried layers and tie the buried layer under the PMOS devices to +V such that the parasitic PNP is not biased for current multiplication.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous and provides a junction isolated Complementary Metal Oxide Semiconductor (CMOS) transistor device used in integrated circuits and other semiconductor devices. It has a layout such that any NMOS transistor devices positioned at a first N-conductivity buried layer and PMOS transistor devices positioned at a second N-conductivity buried layer are spaced adequately apart for breakdown considerations. The NMOS N-conductivity buried layer can be tied to the circuit −V, i.e., ground, and the P-well formed thereat biases the parasitic NPN base and collector at the same potential (−V) so current multiplication will not occur. The PMOS body and second N-conductivity buried layer is tied to +V, the positive supply voltage as before. Thus, the vertical parasitic NPN transistor formed by a N-conductivity buried layer, P-well, and N-conductivity source and drain is turned off to improve the Single Event Effects occurrence. The present invention can be used in any integrated circuit that uses NMOS devices where single event effects are a concern.

In a complementary CMOS transistor device structure, with an N-conductivity substrate and P-buried layer technology, there is an analogous problem with a parasitic vertical PNP transistor in the PMOS transistor device. By separating the P-conductivity buried layer under the NMOS from the P-conductivity buried layer under the PMOS transistor, these two layers can be biased differently such that the PNP remains off during an ion strike. The two transistors are also spaced sufficiently to obtain proper breakdown voltage.

Figure 1A:
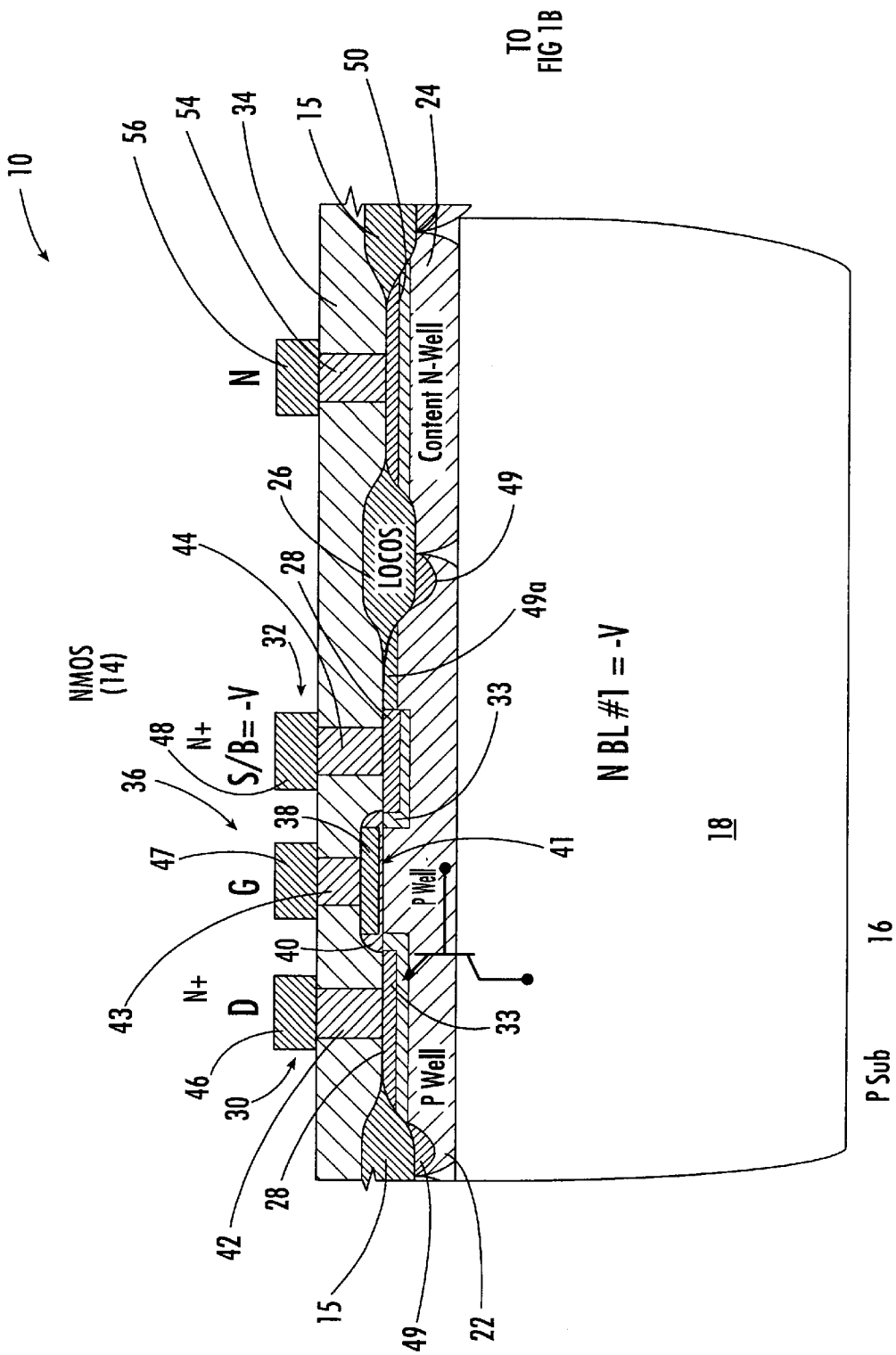
FIGS. 1A and 1B are partial sectional views showing junction isolated Complementary Metal Oxide Semiconductor transistor devices with a P-conductivity substrate and N-conductivity buried layers (N BL).
Figure 1B:
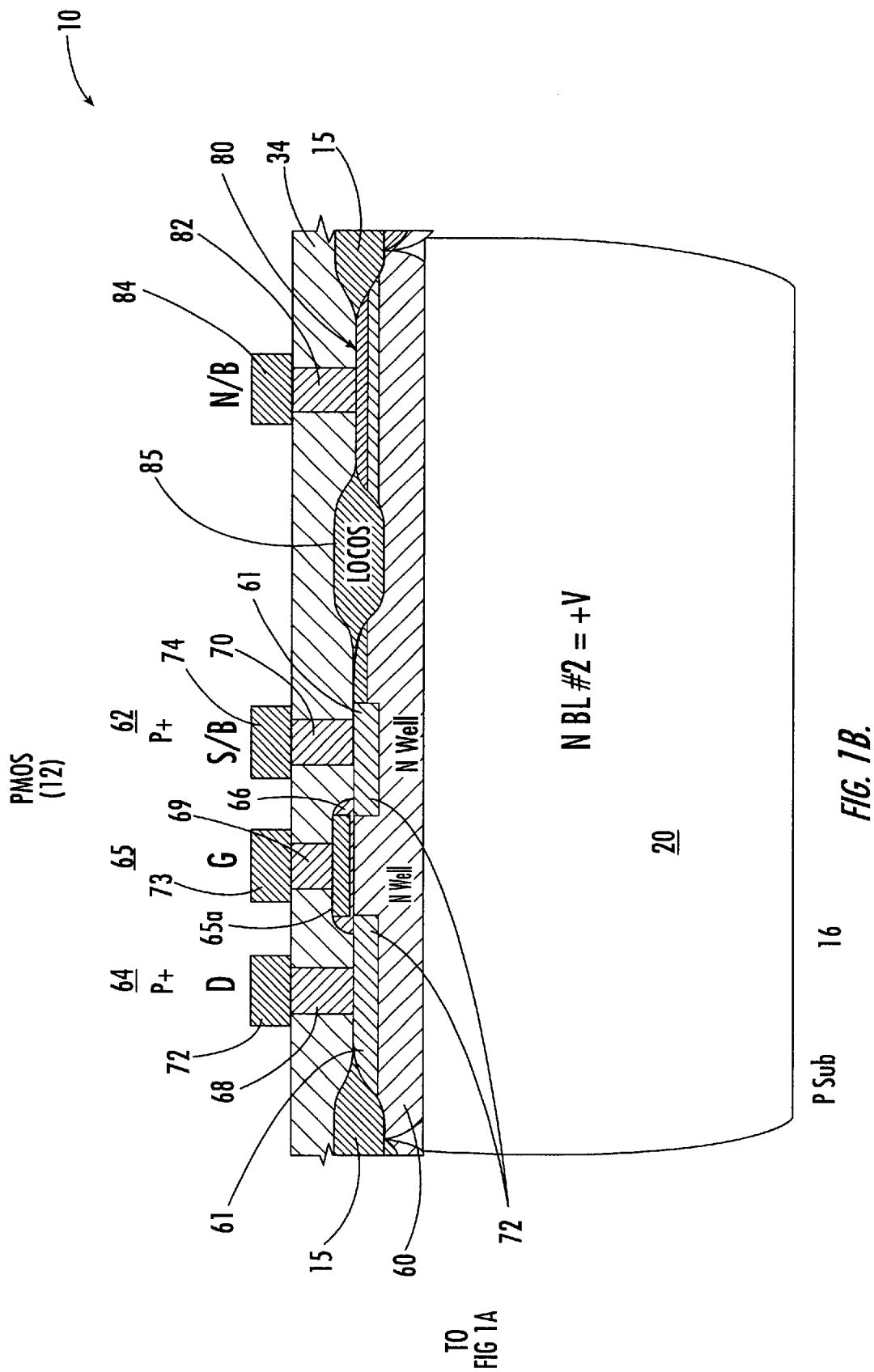

FIGS. 1A and 1B illustrate a junction isolated Complementary Metal Oxide Semiconductor (CMOS) device 10 of the present invention, and showing in FIG. 1B a PMOS transistor 12 and in FIG. 1A the complementary NMOS transistor 14. The PMOS and NMOS transistors are formed and isolated by Local Oxidation of Silicon (LOCOS) devices 15 formed by techniques known to those skilled in the art, using appropriate semiconductor device and integrated circuit deposition and dopant manufacturing techniques. The CMOS transistor device 10 is typically included in a large integrated circuit with other formed semiconductor devices, as is well known to those skilled in the art. Although the present invention will be described relative to the example of FIGS. 1A and 1B, with the illustrated N- and P-conductivities, it should be understood that the present invention is not limited to the illustrated embodiment showing the particular NMOS and PMOS transistor devices.

As illustrated, the device includes a P-conductivity substrate 16 over which first and second N-conductivity buried layers 18,20 are formed as illustrated. A P-well 22 is formed adjacent and illustrated as on top of the first N-conductivity buried layer 18. A contact to the N-conductivity buried layer 18 is made by N-well 24, adjacent the P-well and formed over this first N-conductivity buried layer 18 and separated by an isolation device formed as a Local Oxidation of Silicon structure (LOCOS) 26. As illustrated, doped areas 28 of N-polarity dopant form the respective drain 30 and source 32 areas within the P-well 22, and include lightly doped drain structures 33. A gate 36 is formed by conventional polysilicon layer 38, spacer isolation 40, and gate oxide 41. A passivating layer 34 covers the surface as illustrated, and could be an oxide layer. Tungsten plugs 42,43,44 extend within the passivation layer to respective drain, gate and source structures. Metal contacts 46,47,48 form the respective drain, gate and source/body contacts. P-type Local Oxidation of Silicon (LOCOS) structures 49 are formed as additional LOCOS isolation devices surrounding the NMOS transistor device. A silicide layer 49a shorts the body to the source.

The N-conductivity buried layer contact N-well 24 includes an N+ conductivity area 50 of greater dopant concentration and a tungsten plug 54 with a metal contact 56 to form an N-contact to the contact N-well that is adjacent the P-well 22, both positioned over the first N-conductivity buried layer 18. The N-conductivity buried layer 18 is biased at −V, typically zero volts in accordance with the present invention.

It is evident that the N-contact 56 to the contact N-well 24 contacts the N-conductivity buried layer to give it the desired potential, which in the illustrated aspect of the present invention, is −V.

It is clearly seen from the schematic bipolar transistor that is drawn in the P-well of FIG. 1A, and that this structure forms a parasitic, bipolar transistor device. As explained before, the P-well 22 acts as the base of this parasitic transistor. The N-conductivity buried layer 18 is operative as the collector while the N+ source/drain act as emitters.

As shown in FIG. 1B, the second N-conductivity buried layer 20 has an N-well 60 formed adjacent and over this N-conductivity buried layer. Respective Local Oxidation of Silicon (LOCOS) isolation devices 15 isolate the PMOS transistor, which are formed as having P-dopant 61 added in sufficient concentration to form the PMOS source 62 and drain 64. Gate structure 65 includes polysilicon layer 65a and isolation 66. Tungsten plugs 68,69,70 are operative with respective drain, gate and source/body contacts 72,73,74. Respective additional P-dopant form lightly doped drain structures 72 by semiconductor manufacturing techniques known to those skilled in the art. More heavy N-type doping occurs in an isolated N-type body tie area 80 forming N+ contact, including a tungsten plug 82 and metal contact 84 to form the N-type body tie, which has been LOCOS 85 isolated.

It is evident that N-contact 84, extending to the contact N+ 80 and N-well 60, contacts the N-conductivity buried layer to give it the desired potential, which in the illustrated aspect of the present invention, is +V.

Figure 2:
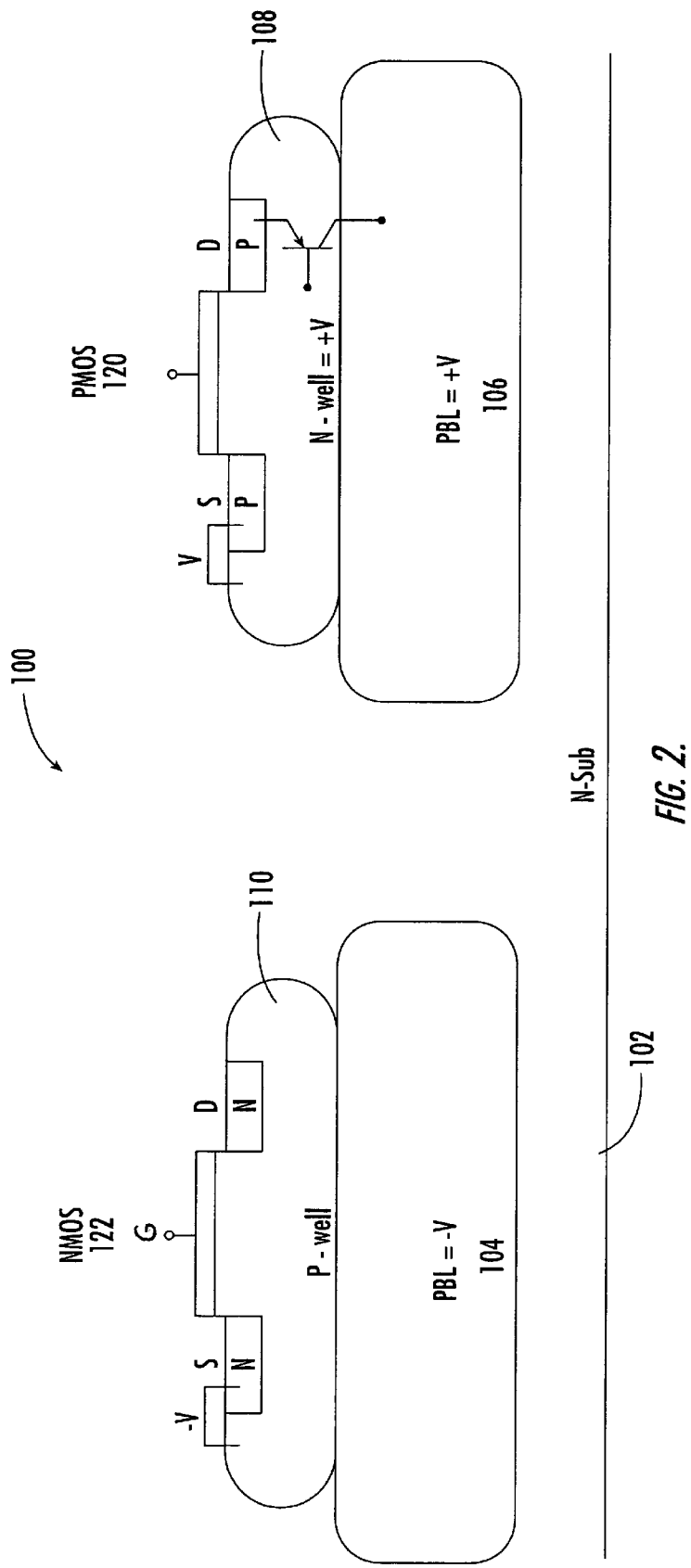
FIG. 2 is a fragmentary, partial sectional view similar to FIGS. 1A and 1B, but showing junction isolated Complementary Metal Oxide Semiconductor transistor devices with an N-conductivity substrate and P-conductivity buried layers.

FIG. 2 illustrates a fragmentary view of complementary junction isolated CMOS device 100 using an N-conductivity substrate layer 102 and P-conductivity buried layer technology showing first and second P-conductivity buried layers 104, 106. As in FIGS. 1A and 1B, respective N-conductivity well 108 and P-conductivity well 110 are formed and the PMOS transistor 120 and the P-conductivity buried layer 106 are separated from the NMOS 122 and the P-conductivity buried layer 104 to allow them to be biased differently such that the PNP transistor formed in the N-well remains off during an ion strike. In this fragmentary view, the basic NMOS transistor and PMOS transistor devices are illustrated in a fragmentary manner only to show the basic structure with the PMOS P-conductivity buried layer biased at a positive signal voltage and the NMOS P-conductivity buried layer biased at ground or −V. The structure shown in FIG. 2 will include the appropriate body contacts and other contacts as explained before.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A Complementary Metal Oxide Semiconductor (CMOS) transistor device comprising:
    a substrate of a first conductivity;
    an epitaxial silicon layer of second conductivity type formed over the substrate;
    a single level buried layer formed from first and second electrically isolated buried layers lateral and adjacent to each other and formed within the epitaxial silicon layer and both having a second conductivity opposite from the first conductivity, wherein the first buried layer is connected to a circuit and ground and the second buried layer is connected to a positive supply voltage;
    a first well region of first conductivity formed above the first buried layer and extending across a portion of the first buried layer;
    a second well region of second conductivity formed above the second buried layer and extending across the second layer;
    a third well region of second conductivity spaced laterally between the first and second well regions, wherein first and third well regions extend across the first buried layer;
    a PMOS transistor formed above the second well region and connected to the positive supply voltage; and
    an NMOS transistor formed above the first well region and spaced laterally from the PMOS transistor and separated by the third well region and forming a parasitic base and collector wherein the first well region biases the parasitic base and collector at the same potential such that current multiplication will not occur to decrease the gain of the parasitic bipolar transistor formed by the MOSFET source/drain regions, the MOSFET body as a well region, and the buried layer, and overcome a single event upset.

2. A device according to claim 1, wherein said first conductivity comprises a P-conductivity and said second conductivity comprises an N-conductivity.

3. A device according to claim 1, wherein said first conductivity comprises an N-conductivity and said second conductivity comprises a P-conductivity.

4. A device according to claim 1, and further comprising a body contact engaging said third well region off second conductivity.

5. A device according to claim 1, and further comprising a local oxidation of silicon that aids in separating the PMOS transistor from the NMOS transistor.

6. A device according to claim 1, and further comprising lightly doped drain structures formed within the respective NMOS and PMOS transistors.

7. A device according to claim 1, and further comprising a gate formed of a polysilicon layer, a spacer isolation, and gate oxide.

8. A device according to claim 1, and further comprising a suicide layer for shorting a source to body in the NMOS or PMOS transistors.

9. A Complementary Metal Oxide Semiconductor (CMOS) transistor device comprising:
    a p-conductivity substrate;
    an N-conductivity epitaxial silicon layer formed over the substrate;
    a single level buried layer formed from first and second electrically isolated N-conductivity buried layers lateral and adjacent to each other and formed within the epitaxial silicon layer, wherein the first buried layer is connected to a circuit and ground and the second buried layer is connected to a positive supply voltage;
    a first well region of P-conductivity formed above the first buried layer and extending across a portion of the first buried layer;
    a second well region of N-conductivity formed above the second buried layer and extending across the second buried layer;
    a third well region of N-conductivity spaced laterally between the first and second well regions wherein first and third well regions extend across the first buried layer;
    a PMOS transistor formed above the second well region and connected to the positive supply voltage; and
    an NMOS transistor formed above the first well region and spaced laterally from the PMOS transistor and separated by the third well region and forming a parasitic base and collector wherein the first well region biases the parasitic base and collector at the same potential such that current multiplication will not occur to decrease the gain of the parasitic bipolar transistor formed by the MOSFET source/drain regions, the MOSFET body as a well region, and the buried layer, and overcome a single event upset.

10. A device according to claim 9, and further comprising a body contact engaging said third well region.

11. A device according to claim 9, and further comprising a local oxidation of silicon that aids in separating the PMOS transistor from the NMOS transistor.

12. A device according to claim 9, and further comprising lightly doped drain structures formed within the respective NMOS and PMOS transistors.

13. A device according to claim 9, and further comprising a gate formed of a polysilicon layer, a spacer isolation, and gate oxide.

14. A device according to claim 9, and further comprising a suicide layer for shorting a source to body in the NMOS or PMOS transistors.

* * * * *